Sept. 16, 1969

N. J. MILLER 3,467,839

J-K FLIP-FLOP

Filed May 18, 1966

INVENTOR.
Norman J. Miller

BY

Mueller, Aichele & Rauner

ATTY'S.

United States Patent Office 3,467,839
Patented Sept. 16, 1969

3,467,839

J-K FLIP-FLOP

Norman J. Miller, Geneva, Switzerland, assignor to Motorola, Inc., Franklin Park, Ill., a corporation of Illinois Filed May 18, 1966, Ser. No. 551,134
Int. Cl. H03k 3/286
U.S. Cl. 307—289 9 Claims

ABSTRACT OF THE DISCLOSURE

A J-K flip-flop having a set-reset bistable element including set and reset input terminals. First and second input gates are connected to receive input J and K binary information and first and second output gates are connected between the outputs of the first and second input gates, respectively, and the set and reset terminals of the set-reset bistable element. A latch gate is connected to receive both clock signals, the output information from the first and second input gates, and the output information from the first and second output gates. The latch gate responds to clock signals, and the outputs of the first and second input and output gates to insure a determinate state of the set-reset bistable element during simultaneous application of J and K binary logic signals at inputs of the first and second input gates.

This invention relates generally to bistable flip-flops of the type which have no indeterminate state for any binary logic input signal condition. These flip-flops are known in the computer art as J-K flip-flops, and the J-K function provided by these flip-flops is that of insuring that the flip-flop will have a determinate state when two identical binary switching signals at voltage levels sufficiently high to change the state of the flip-flop are simultaneously applied to separate inputs of the flip-flop. More particularly, this invention resides in the implementation of the J-K function by using a novel gating control circuit in combination with an R-S flip-flop.

Prior art J-K flip-flops normally utilize capacitance storage or storage effects of transistors to control the J-K function. However, in flip-flop circuits having either of these storage means, the maximum frequency of operation is limited by the inherent delay problems caused by the time response in the capacitance or other transistor storage type elements.

Accordingly, it is an object of this invention to provide an improved J-K flip-flop which does not require capacitance or other storage elements to provide the J-K function mentioned above.

Another object of this invention is to provide a new and improved J-K flip-flop capable of simultaneously accepting two logic signals at identical voltage levels and responding thereto in such a manner that the state of the flip-flop will always be determinate.

Another object of this invention is to provide a J-K flip-flop which may be set and reset by DC signals, independently of the J and K input information applied thereto and regardless of the level of clock signals which control the shifting of J and K information into the flip-flop.

Another object of this invention is to provide a new and improved J-K flip-flop including current mode gating circuity operative to extend the frequency range of known J-K flip-flops and which eliminates race problems associated with presently known delay-type flip-flops.

A further object of this invention is to provide a new and improved J-K flip-flop into which binary information may be shifted in a minimum of time and wherein the probability of extraneous noise switching the conductive state of the flip-flop has been reduced to a minimum.

A feature of this invention is the provision of a J-K flip-flop including a bistable element having set and reset states and an indeterminate state when simultaneous binary ONE's are applied thereto. The J-K flip-flop further includes first and second input gates for receiving binary information to be shifted into the bistable element to control the conductive state thereof and first and second output gates connected respectively between the outputs of the first and second input gates and the set and reset input terminals of the bistable element. A latch out gate is connectable to a source of clock signals and is connected to each of the first and second input gates and to each of the first and second output gates, and this latch out gate insures that the state of the bistable element will always be determinate upon the simultaneous application of J and K binary ONE's at the inputs to the first and second input gates.

Another feature of this invention is the provision of a new bistable latch out gate which provides a NOR logic function and which includes a plurality of emitter coupled transistors for receiving binary logic signals. These emitter coupled transistors are connected to switch against a reference transistor to which a variable reference voltage is applied via a positive feedback connection between the reference transistor and the emitter coupled transistor pairs. The inclusion of a variable reference voltage in the latch out NOR gate insures that the output logic signal from this gate can be driven to a binary ONE level before all of the input signals applied to the emitter coupled transistors fall to a binary ZERO logic level.

These and other objects and features of the invention will be more fully apparent in the following description of the accompanying drawing wherein.

Briefly described, the J–K flip-flop according to the present invention includes a set-reset bistable element to which is coupled first and second input gates for receiving J and K binary information and first and second output gates connected directly between the first and second input gates respectively and the set and reset inputs of the bistable element. As J and K input information is applied to the input terminals respectively of the first and second input gates, it is shifted through the first and second output gates into the bistable element in accordance with the conductive state of a latch-out gate. The input of this latch-out gate is connectable to a source of clock signals and its output is connected to the inputs of each of the first and second inputs gates and to the inputs of each of the first and second output gates. This latch-out gate is responsive to clock signals to shift information into the bistable element when alternate ONE's and ZERO's are applied to J and K inputs of the first and second input gates. This latch-out gate is also operative to enable the J-K flip-flop to switch as a straight binary divider when binary ZERO's are simultaneously applied to the J and K inputs and operative to inhibit the first and second output gates when binary ONE's are simultaneously applied to the J and K inputs thereby insuring that the state of the bistable element is always determinate.

Figure 1:
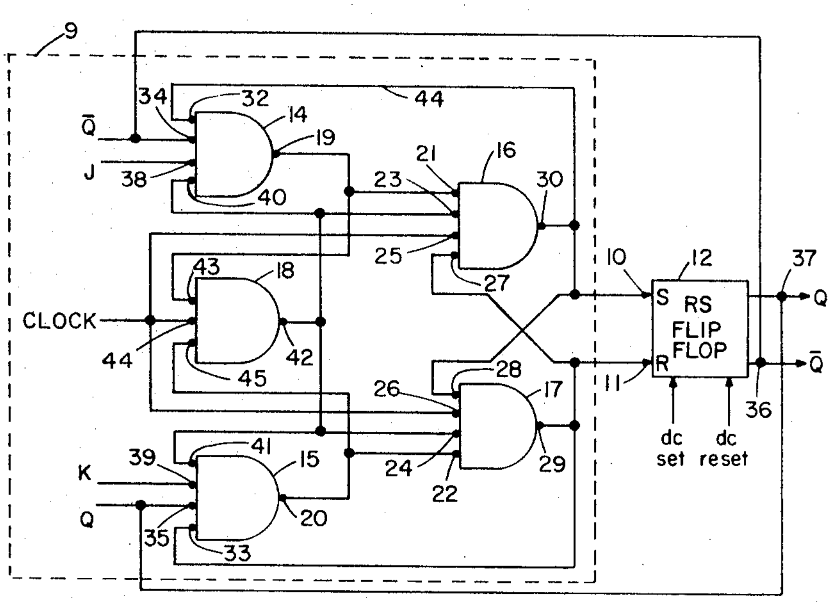
FIG. 1 is a block diagram of the J-K flip-flop according to this invention.

Referring in detail to the drawing, there is shown in FIG. 1 an input gating circuit 9 connected to the input set and reset terminals 10 and 11 of an R-S flip-flop 12. The R-S flip-flop 12 is well known to those familiar with basic components used in electronic computers, and the conductive state of this flip-flop is controlled by the binary information at the input set and reset terminals 10 and 11 thereof. However, when the R-S flip-flop 12 is switched directly to binary information at terminals 10 and 11, it has an indeterminate state if binary switching signals at voltage levels sufficiently high to change the state of the flip-flop are simultaneously applied to the set and reset input terminals 10 and 11. In other words, if a binary ONE and a binary ZERO are applied to terminals 10 and 11 respectively or to terminals 11 and 10 respectively, the flip-flop 12 will be switched to a known state. If, however, (using positive logic) binary ONE's are simultaneously applied to set and reset terminals 10 and 11, the flip-flop 12 may or may not change conductive states, depending upon its internal electrical characteristics.

In accordance with the present invention, R-S flip-flop 12 has been uniquely combined with gating circuit 9 to form a J-K bistable flip-flop, the conductive state of which is by definition always determinate.

The section 9 of the J-K flip-flop in FIG. 1 includes five NOR gates 14, 15, 16, 17 and 18, connected in the cascade arrangement shown, and these gates include first and second input gates 14 and 15 to which the J and K input information is applied. The NOR gates 14 and 15 are connected at the output terminals 19 and 20 thereof directly to first input terminals 21 and 22 of first and second output gates 16 and 17, respectively.

Each of the first and and second output gates 16 and 17 further includes second input terminals 23 and 24, third input terminals 25 and 26, and fourth input terminals 27 and 28, respectively. The fourth input terminal 27 of first output gate 16 is connected directly to a single output terminal 29 of second output gate 17, and a fourth input terminal 28 of second output gate 17 is connected directly to the single output terminal 30 of the first output gate 16.

The first and second input gates 14 and 15 also include a plurality of input terminals comprising first input terminals 32 and 33 which are connected to output terminals 30 and 29, respectively, of the output gates 16 and 17. Further included in the first and second input gates 14 and 15 are second $\overline{Q}$ and Q input terminals 34 and 35 which are connected to the $\overline{Q}$ and Q outputs 36 and 27 of the R-S flip-flop 12. J and K input information is applied to third input terminals 38 and 39 of the first and second input gates 14 and 15 respectively, and fourth input terminals 40 and 41 of input gates 14 and 15 are both connected directly to the output terminal 42 of the latch-out gate 18.

The latch-out gate 18 has three input terminals 43, 44 and 45, and a source of clock pulses is connectable directly to terminal 44 and also to third input terminals 25 and 26 of the first and second output gates 16 and 17, respectively. Input terminals 43 and 45 are connected directly to the output terminals 19 and 20 of the first and second input gates 14 and 15, and the balanced switching arrangement in FIG. 1 is responsive to J and K input information together with clock signals at terminal 44 to provide the J-K switching function in the following manner.

Operation

The J-K flip-flop in FIG. 1 may best be understood by examining the operation thereof during the simultaneous application of J and K binary ONE's to the third input terminals 38 and 39, of the first and second input gates 14 and 15. In the following description of the operation of the flip-flop in FIG. 1, positive logic will be used and a binary ONE level will be high and a binary ZERO level will be low or at a voltage level at some value below the binary ONE.

Assume that the state of the R-S flip-bop 12 is such that Q output at terminal 37 is at a ONE level and the $\overline{Q}$ output at terminal 30 is at a ZERO level. Assume also that both of the binary J and K input signals at terminals 38 and 39 are at a ZERO level when the clock signal applied at terminal 44 drops from a binary ONE level to a binary ZERO level, a clock condition necessary for shifting J and K input information into the R-S flip-flop 12. Immediately prior to the clock going low to binary ZERO, all of the input terminals 32, 34, 38 and 40 of the first input gate 14 will be at a ZERO level since (1) the $\overline{Q}$ and J input levels are binary ZERO for the conditions assumed, (2) the output voltage level on conductor 44 and fed back from output terminal 30 is ZERO as long as the clock signal is high and until a finite time after it begins to fall toward binary ZERO and (3), the output level at terminal 42 is at a binary ZERO level when the clock signal is high at a binary ONE level. Therefore, with an "all ZERO" condition existing at the input terminals of first input gate 14, a binary ONE signal is present at output terminal 19 and at the first input terminal 21 of first output gate 16.

The NOR gate 15 on the other hand, having at least one input terminal 35 at a binary ONE level, will present a binary ZERO at output terminal 20 and at the first input terminal 22 of the second output gate 17. This binary ZERO level at terminal 22 will, together with the three other inputs 24, 26 and 28, establish an "all ZERO" condition at these four input terminals of second output gate 17 once the clock signal applied to terminal 26 goes to ZERO. When this happens, a logical ONE level at the output terminal 29 of second output gate 17 will be applied to the reset terminal 11 of the R-S flip-flop 12, and this will shift the R-S flip-flop from its set to reset state, thereby raising the $\overline{Q}$ output at terminal 36 to a logical ONE level and dropping the Q output at output terminal 37 to a logical ZERO level. Thus when the J and K input signals are simultaneously at a binary ZERO level, the circuit of FIG. 1 will act as a straight binary divider every time the clock pulse drops from a binary ONE level to a binary ZERO level.

After the R-S flip-flop 12 has changed states and the $\overline{Q}$ output at terminal 36 has been raised to a binary ONE level, both the first and second input gates 14 and 15 have ZERO level outputs at terminals 19 and 20 which are connected to the input terminals 43 and 45 of latch-out gate 18. Therefore, a binary ONE level will be produced at the latch-gate output terminal 42 and applied to the second input terminals 23 and 24 of output gates 16 and 17 a finite time after the R-S flip-flop 12 has changed its conductive state. This binary ONE, when coupled to the second input terminals 23 and 24 of first and second output gates 16 and 17 will latch these gates out and prevent the state of the R-S flip-flop 12 from being affected by any further changes in the J and K levels at terminals 38 and 39.

The latch-out gate 18 is unique in that the binary output level at terminal 42 rises to a logical ONE level prior to the time that the clock signal at terminal 44 has dropped all the way to a logical ZERO level if binary ZERO's are also applied to input terminals 43 and 45. As will be more fully understood with reference to FIG. 2, the latch-out gate 18 can be adjusted so that the output level at terminal 42 will rise to a binary ONE at different input voltage levels between the levels of binary ONE and binary ZERO.

When the clock signal returns to a binary ONE level, the switching delay in the latch-out gate 18 insures that the output of this gate does not return to a binary ZERO level prior to clock signal returning to a binary ONE level. This feature insures that the first and second output gates 16 and 17 are inhibited until the clock again goes low.

The fact that the first and second output gates 16 and 17 are completely deactivated immediately after the J and K information has been shifted into the flip-flop 12 is a most important feature of this invention. This enables the R-S flip-flop 12 to be DC set and reset once the J and K information has changed the state of the flip-flop regardless of the binary levels at the J and K input terminals 38 and 39.

Now consider the situation where both the J and K inputs are simultaneously at a binary ONE level when the clock goes to a binary ZERO level. Both of the output terminals 19 and 20 will be at a binary ZERO level and now both input terminals 43 and 45 will be at a binary ZERO level when the clock goes low. Since the output level at terminal 42 of the latch-out gate 18 rises to a binary ONE level before the clock level reaches a binary ZERO level, latch-out gate 18 will inhibit operation of the first and second output gates 16 and 17 before an "all ZERO" condition can exist at the input terminals of first output gate 16 or second output gate 17. This prevents either output terminal 29 or output terminal 30 from going to a binary ONE level and thus the state of the flip-flop will remain unchanged.

When the J and K inputs at terminals 38 and 39 alternately change from a binary ONE to a binary ZERO level, this information is shifted through the input gates 14 and 15 and through the output gates 16 and 17 to control the conductive state R-S flip-flop 12 in a normal manner. For example, if the $\overline{Q}$ output terminal 36 is at a binary ZERO level and the J input level at terminal 38 is also binary ZERO, an "all ZERO" condition will exist at the input terminals of gate 14 as long as clock signal at line 44 is at a binary ONE level and output terminal 42 is at a binary ZERO level. Thus, the first input terminal 21 of first output gate 16 will be at a binary ONE level when the clock goes low. On the other hand, with the K and Q inputs at terminals 39 and 35 at a binary ONE level, the output of second input gate 15 will be at a binary ZERO level and will combine with three other binary ZERO inputs to the second output gate 17 once the clock goes low, to produce a binary ONE level at the output terminal 29 of the second output gate 17. This binary ONE signal is coupled to the reset terminal 11 of the R-S flip-flop 12 to change the state of this flip-flop, with the $\overline{Q}$ output at terminal 36 rising to a binary ONE level and the Q output terminal 37 dropping to a binary ZERO level.

However, if in the example given above the Q output had previously been at a binary ONE level, then an "ALL ZERO" condition would have existed at neither of the input terminals of the first and second input gates 14 and 15, and a binary ZERO level would have been coupled from output terminals 19 and 20 to the input terminals 43 and 45 of the latch-out gate 18. Under this condition the latch-out gate 18 would have operated when the clock signal approached a binary ZERO level to raise the input level at second input terminals 23 and 24 to a binary ONE, thus inhibiting the first and second output gates 16 and 17 and maintaining the conductive state of the flip-flop 12 unchanged.

Therefore, in order for the J and K input signals at terminals 38 and 39 to change the state of the J-K flip-flop, in FIG. 1, they must have a predetermined logical relationship to the existing state of the R-S flip-flop which is an integral part of the J-K flip-flop.

Figure 2:
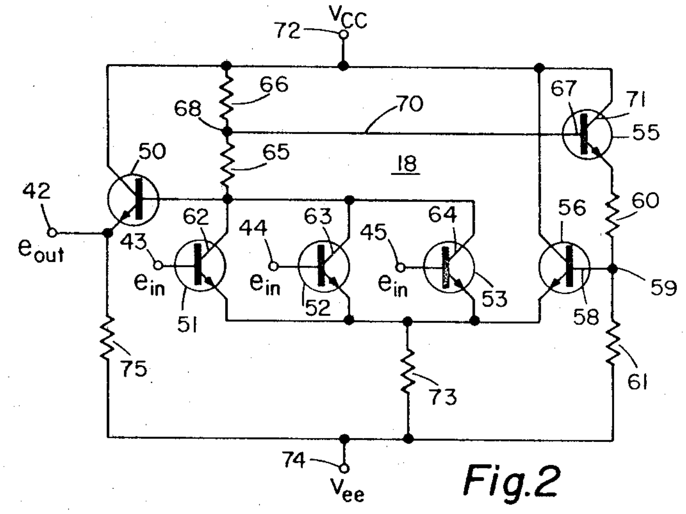
FIG. 2 is a schematic diagram of the latch out gate in FIG. 1 to which clock signals are applied.

FIG. 2 is a schematic diagram of latch-out gate 18 in FIG. 1 and includes input terminals 43, 44 and 45 and an output terminal 42 from which an output signal *e* out is derived at the emitter of output transistor 50. Output terminal 42 is at a binary ZERO level if any one input *e* in which is applied to the emitter coupled transistor 51 and 52 and 53 is a binary ONE level. The NOR gate in FIG. 2 includes emitter couple transistor logic circuits similar to that disclosed in the Narud et al. patent application Ser. No. 344,718, now Patent No. 3,259,761, and assigned to the assignee of the present application.

The NOR gate in FIG. 2 further includes a level shifting transistor 55 and a reference transistor 56 against which the emitter coupled transistors 51, 52 and 53 switch. The base electrode 58 of the reference transistors 56 is connected to the midpoint 59 of resistors 60 and 61, and the collector electrodes 62, 63 and 64 of the emitter coupled transistors 51, 52 and 53 are connected to a pair of series connected resistors 65 and 66. The level shifting transistor 55 is connected at the base 67 thereof to the midpoint 68 of series connected resistors 65 and 66 and at the collector 71 thereof to a supply voltage V*cc* at terminal 72. A common emitter resistor 73 is connected between the emitters of transistors 51, 52 and 53 and a supply voltage V*ee* at terminal 74, and an output load resistor 75 is connected between the emitter of output transistor 50 and the V*ee* supply terminal 74.

If at any time the binary signals which are applied to the base terminals 43, 44 and 45 of the emitter coupled transistors 51, 52 and 53 respectively drop to a binary ZERO level, the voltage at the collector electrodes 62, 63 and 64 will rise and this voltage transistion will be coupled through the emitter-base junction of output transistor 50 to produce a binary ONE at the output terminal 42.

When the voltage level initially begins to decrease at the remaining transistor 51, 52 or 53 which is conducting heavily immediately prior to an "all ZERO" condition at terminals 43, 44 and 45, a small positive voltage transition is coupled to the base region 67 of transistor 55, increasing the current flow in transistor 55 and producing a corresponding increase in voltage at the midpoint 59 or resistors 60 and 61. This increase in voltage at the base region of reference transistor 56 will effectively change the voltage level to which the binary input signals $e_{in}$ must drop before a binary ONE is produced at the output terminal 42 and thereby produce the bistable switching action graphically illustarted in FIG. 3. This positive feedback via connection 70 in FIG. 2 effectively shifts the voltage level at point 59 and thus produces a variation in "reference" voltage at the base 58 of reference transistor 56 against which the binary input signals $e_{in}$ switch. This operation differs from that disclosed in the above-identified Narud application Ser. No. 344,718 wherein the reference voltage is fixed.

Therefore, in the circuit in FIG. 2 it is possible to drive the output logic level at terminal 42 to a binary ONE before all of the input signals $e_{in}$ reach a binary ZERO level. This makes it possible for the latch-out gate 18 in FIG. 1 to provide a binary ONE level at second terminals 23 and 24 of the output gates 16 and 17 before the clock signal can drop to a binary ZERO level at the third input terminals 25 and 26 of output gates 16 and 17 and produce a "not allowed" condition at the input to the R-S flip-flop 12.

Figure 3:
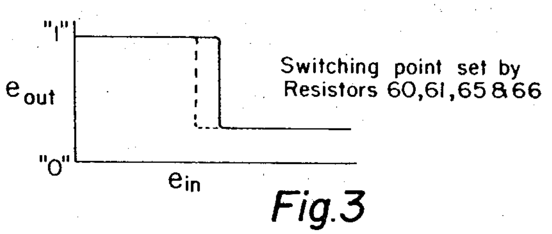
FIG. 3 is a graph of input voltage verses output voltage for the schematic diagram in FIG. 2.

The graph in FIG. 3 showing input voltage $e_{in}$ versus output voltage $e_{out}$ illustrates how the switching point of the NOR gate in FIG. 2 can be varied by changing the values of resistance for resistor components 65, 66, 60 and 61. By varying the value of any one of these resistors, the reference voltage at the base of reference transistor 56 and the voltage level of $e_{in}$ required to drive all of the emitted coupled transistors 51, 52 and 53 to a very low conductive state (and $e_{out}$ to a binary ONE level) may be also be varied.

I claim:

1. In a J-K flip-flop including a set-reset bistable element having set and reset input terminals and first and second output terminals, the bistable element having an indeterminate state upon the simultaneous application of binary logic signals to the set and reset terminals of the bistable element and at identical switching levels sufficiently high to change the conductive state of the bistable element, the improvement comprising;

(a) first and second input gate means for receiving binary information to be shifted into said bistable element to control the conductive state thereof, said first and second input gate means each having a plurality of input terminals and an output terminal, (b) first output gate means having a plurality of input terminals and an output terminal, said first output gate means connected between said output terminal of said first input gate means and said set terminal of said bistable element, (c) second output gate means having a plurality of input terminals and an output terminal, said second output gate means connected between said output terminal of said second input gate means and said reset terminal of said bistable element, said first and second output gate means operative to shift said binary information into said bistable element during the existence of a predetermined signal condition at said plurality of input terminals of said first and second output gate means, and (d) latch gate means connectable to a source of clock signals and connected to each of said first and second input gate means and connected to each of said first and second output gate means for providing a determinate conductive state at said bistable element during the simultaneous application of binary logic signals at an input terminal of each of said first and second input gate means and at identical switching levels sufficiently high to change the state of said bistable element.

2. In a J-K flip-flop including a bistable element having set and reset input terminals and first and second output terminals, the bistable element having an indeterminate state upon the simultaneous application of binary logic signals to the set and reset terminals of the bistable element and at identical switching levels which are sufficiently high to change the conductive state of the bistable element, the improvement comprising:

(a) first and second input gate means for receiving binary information to be shifted into said bistable element to control the conductive state thereof, said first and second input gate means each having a plurality of input terminals and an output terminal, (b) first output gate means having a plurality of input terminals and an output terminal, said first output gate means connected between said output terminal of said first input gate means and said set terminal of said bistable element, (c) second output gate means having a plurality of input terminals and an output terminal, said second output gate means connected between said output terminal of said second input gate means and said reset terminal of said bistable element, said first and second output gate means operative to shift said binary information into said bistable element during the existence of a predetermined signal condition at said input terminals thereof, and (d) latch gate means connectable to a source of clock signals and connected to each of said first and second input gate means for providing a determinate state at said bistable element during the simultaneous application of identical binary logic signals at an input terminal of each of said first and second input gate means and at switching levels sufficiently high to change the state of said bistable element, said latch gate means having a single output terminal and a plurality of input terminals, one of which is operatively connectable to and controlled by a source of clock signals, (e) said output terminal of said latch gate means connected to an input terminal of each of said first and second output gate means for controlling the conductive state of said first and second output gate means, and (f) means connecting said output terminals of said first and second input gate means to different input terminals in said plurality of input terminals of said latch gate means for preventing the passage of information through said first and second output gate means during the simultaneous application of identical binary logic signals at the input terminals respectively of said first and second input gate means, said logic signals being at said switching levels sufficiently high to change the state of said bistable element.

3. The circuit according to claim 2 wherein said latch gate means includes a bistable gate to which said plurality of input terminals and said single output terminal are connected, said bistable gate responsive to a predetermined pattern and level of binary input logic signals for providing an inhibiting output signal at one of said plurality of input terminals of each of said first and second output gate means during the simultaneous application of said identical binary logic signals at an input terminal in each plurality of input terminals of each of said first and second input gate means, said bistable gate being non-responsive to binary logic signals at different logic levels at said input terminal in each plurality of input terminals of said first and second input gate means and thereby enabling one of said first and second output gate means to transfer binary information into said bistable element.

4. The circuit according to claim 2 which further includes conductive means for simultaneously applying clock signals to said first and second output gate means and to said latch gate means for enabling passage of binary information from said first and second input gate means through said first and second output gate means, respectively, and into said bistable element when said clock signal is at a predetermined level, said latch gate means responsive to clock signals and to the output signal condition at said output terminals of said first and second input gate means for controlling the conductive state of said first and second output gate means.

5. The circuit according to claim 4 wherein each of said first and second input gate means, each of said first and second output gate means and said latch gate means are NOR gates, one of said first and second output gate means responding to the output signal condition at said output terminals of one of said first and second input gate means respectively and the output signal condition at said output terminal of said latch gate means for changing the state of said bistable element during the simultaneous application of binary signals at different logic levels to one input terminal of each of said first and second input gate means respectively, and during the application of clock signals at a predetermined voltage level to one input terminal of said latch gate means.

6. The flip-flop circuit according to claim 5 wherein said plurality of input terminals of each of said first and second output gate means includes first, second, third, and fourth input terminals, said first input terminals of said first and second output gate means connected respectively to said output terminals of said first and second input gate means, said second input terminals of said first and second output gate means connected to said output terminal of said latch gate means, said third input terminals of said first and second output gate means connected to a source of clock signals, and said fourth input terminals of said first and second output gate means being connected respectively to said output terminals of said second and first output gate means.

7. The flip-flop circuit according to claim 6 which further includes (a) means connecting said first and second output terminals of said bistable element directly to one input terminal of said first and second input gate means respectively, and (b) means connecting said output terminals of said first and second output gate means directly to another input terminal of said first and second input gate means respectively.

8. The flip-flop circuit according to claim 7 wherein said latch gate means includes (a) a plurality of emitter coupled parallel connected input transistors for receiving binary logic signals,
(b) a reference transistor emitter coupled to said plurality of input transistors at a common junction,
(c) a common emitter resistor connected between said common junction and a first voltage supply terminal,
(d) output circuit means connected to said plurality of emitter coupled input transistors, and
(e) feedback means connected between said output circuit means and said reference transistor for providing a variable reference potential at said reference transistor in response to input logic signals at said input transistors.

9. The flip-flop circuit according to claim 8 wherein
(a) said output circuit means includes a first voltage divider connected between said plurality of emitter coupled transistors and a second voltage supply terminal and includes an output transistor connected to said plurality of said input transistors for providing a binary output logic signal responsive to input logic signals at said plurality of emitter coupled input transistors, and
(b) said feedback means includes a level shifting transistor connected to said first voltage divider, and a second voltage divider connected between said level shifting transistor and said reference transistor for providing a variation in voltage at said reference transistor in response to current variations in said first voltage divider and thereby providing a bistable switching action for said latch gate means.

References Cited

UNITED STATES PATENTS 3,358,238 12/1967 Shapiro et al. ---- 328—206 XR

OTHER REFERENCES

An article titled Digital Electronics—A Review, Part I, written by G. W. R. Hole, appearing in Proceedings I.R.E.E., Australia, pp. 1–13 and dated January 1968.

ARTHUR GAUSS, Primary Examiner

STANLEY T. KRAWCZEWICZ, Assistant Examiner

U.S. Cl. X.R.

307—203, 215, 241; 328—96, 97, 206